United States Patent [19]
Moriguchi

[11] Patent Number: 5,827,998
[45] Date of Patent: Oct. 27, 1998

[54] ELECTROMAGNETIC SHIELDING STRUCTURE HAVING RADIO WAVE-ABSORBING MATERIAL

[75] Inventor: Tatsuji Moriguchi, Tokyo, Japan

[73] Assignee: NEC Corporation, Tokyo, Japan

[21] Appl. No.: 600,244

[22] Filed: Feb. 12, 1996

[30] Foreign Application Priority Data

Feb. 14, 1995 [JP] Japan .................................. 7-025008

[51] Int. Cl.$^6$ ...................................................... H05K 9/00
[52] U.S. Cl. .................................. 174/35 MS; 174/35 R; 174/35 C
[58] Field of Search ......................... 174/35 MS, 35 GC, 174/35 R, 35 C, 17 CT; 244/158 A

[56] References Cited

U.S. PATENT DOCUMENTS 4,713,275  12/1987  Riccitello et al. ........................ 428/76
4,773,534   9/1988  DeHeras et al. ......................... 206/328

FOREIGN PATENT DOCUMENTS 2236910  4/1991  United Kingdom .
2252677  8/1992  United Kingdom .

*Primary Examiner*—Kristine L. Kincaid
*Assistant Examiner*—Kristina Soderquist
*Attorney, Agent, or Firm*—Ostrolenk, Faber, Gerb & Soffen, LLP

[57] ABSTRACT

An electromagnetic shielding structure is formed from a first bracket 11 in which a box plate 11a having a c-shaped cross section accommodates a radio wave-absorbing material 11b having a surface of serrate cross section that contacts a thermal blanket 2, and a second bracket 12 having a serrate form that can mesh with the serrate form of the first bracket. The thermal blanket 2 is held and secured between the first and second brackets 11, 12. The thermal blanket 2 can be firmly joined to the satellite body by securing the first bracket 11 to the satellite body with screws. Leaked signals X are attenuated by the box plate 11a and the radio wave-absorbing material 11b. Leaked signals passing through gaps between the thermal blanket 2 and the radio wave-absorbing material 11b are greatly attenuated due to the length of the passage resulting from the serrate form.

7 Claims, 2 Drawing Sheets

ELECTROMAGNETIC SHIELDING STRUCTURE HAVING RADIO WAVE-ABSORBING MATERIAL

BACKGROUND OF THE INVENTION

1. Field of the Invention

The present invention relates to an electromagnetic shielding structure, and particularly to an electromagnetic shield structure for securing a thermal blanket used in a satellite to the satellite body.

2. Description of the Related Art

Various types of this kind of electromagnetic shielding structure have been developed for suppressing unwanted leakage or emission of electromagnetic waves from electronic equipment. Examples of shielding include shield material exhibiting a great degree of transmission attenuation when electromagnetic waves pass through the shield material, a tape form as shown in FIG. 2(A) in which linear magnetic members 24 are arranged in parallel and fixed by resin 25, or a layered form as shown in FIG. 2(B) in which thin-layer films of linear magnetic members 24 arranged and fixed by resin 25 are stacked on a metal plate 26. Such shielding suppresses current induced toward the inner walls of the casing caused by the effect of the electromagnetic interference. Leakage of this induced current to the outside of the casing takes place by way of spaces between contacting points in the case, and therefore, as disclosed in, for example, Japanese Patent Laid-open No. 194399/88, a tape 34 of shielding material composed of linear magnetic material arranged as shown in FIG. 3(A) and gasket material 33 having good conductive performance and joined by adhesive 35 can be used at the seam portions of a case 30 such as shown in FIG. 3(B) to shield leaking electromagnetic waves.

To maintain internal temperatures of a satellite within a prescribed range, the upper portion of the satellite is covered by a thermal blanket formed from heat insulation material and metal film, within which is installed equipment such as receivers amplifying low-level signal. Such equipment is exposed to a portion of the radio waves emitted toward the upper portion of the satellite body from the antenna provided on the upper portion of the satellite body. In the prior art, surface fasteners 21, 22 are attached along the edge of thermal blanket 2 as shown in FIG. 1, and thermal blanket 2 is secured to the satellite body by means of these surface fasteners 21, 22.

Of the above-described electromagnetic shielding structures of the prior art, the structures shown in FIGS. 2 and 3 are electromagnetic shielding materials of induced current-suppressing type that suppress leakage of electromagnetic waves from electronic equipment by suppressing the current component induced in the inner wall surfaces of the casing due to the magnetic field generated within the case and are formed as a flat tape that is further combined with a conductive gasket and adhered to the inner case surfaces. When used at the coupling portions between the body of a satellite and a thermal blanket, this type of electromagnetic shielding structure cannot serve as an effective electromagnetic shielding material due to the drawback that a tight seal is difficult to achieve between the thermal blanket and electromagnetic shielding material because the thermal blanket is easily deformed.

In addition, when using surface fasteners for securing the edge portion of a thermal blanket 2 to the body of a satellite 1 as shown in FIG. 1, there is the drawback that radio waves can pass through the surface fasteners and their contact surfaces, thereby allowing radio waves emitted from the satellite antenna to easily reach equipment emplifying low-level signal that is covered by the thermal blanket, and as a result, repeaters installed on board the satellite may oscillate or ripple may occur in the gain or delay frequency characteristics of the repeaters. In addition, such surface fasteners are disadvantageous in that they provide a weak bond.

SUMMARY OF THE INVENTION

The object of the present invention is to provide an electromagnetic shielding structure that improves EMC (Electromagnetic Compatibility) performances of a satellite by preventing leakage of signals to the satellite equipments through the points of juncture between the satellite body and edge of the thermal blanket, and in addition, provides stronger coupling means in the junction portion.

To achieve the above-described objects, an electromagnetic shielding structure according to the present invention is formed from two opposing members, the two opposing surfaces of the two opposing members capable of being placed in close contact; and a radio wave-absorbing material on the surface of at least one of said opposing members having an uneven surface that can be placed in close contact with the other of said opposing members.

A preferable form of an electromagnetic shielding structure of the present invention is arranged at the securing portion between a satellite body and a thermal blanket and includes a first bracket wherein the surface of the side contacting the thermal blanket includes a radio wave-absorbing material that forms an uneven surface, and the surface of the side contacting the satellite body can be brought into close contact with the satellite body; and a second bracket having an uneven surface that can fit together with the uneven surface of the first bracket and, by means of this uneven surface, the thermal blanket may be pressed against the first bracket.

Furthermore, the above-described uneven surface is preferably in a serrate form, and a screw means is preferably included that allows the first bracket and the satellite body to be brought into close contact.

According to above-described electromagnetic shielding structure of the present invention, because the edge portion of the thermal blanket is held and secured to the satellite body between brackets that include a radio wave-absorbing material having serrated cross section, not only are leaked signals that leak into the satellite equipments from the secured portions attenuated by the radio wave-absorbing material and the brackets, but leaked signals that pass through the gap between the thermal blanket and radio wave-absorbing material are still further attenuated due to the length of passage caused by the serrated form. Furthermore, the serrated surface strengthens the securing of the thermal blanket.

The above-described invention has the effect of preventing leakage of signals to the satellite equipments because, at the portions where a thermal blanket is secured to a satellite body, the thermal blanket is secured to the satellite body by being held between a first bracket that includes a radio wave-absorbing material having a serrated form and a second bracket meshes with the first bracket, thereby causing a significant attenuation of leaked signals. Accordingly, the invention further exhibits the effect that repeater installed in the satellite does not oscillate, and ripple does not occur in the gain or delay frequency characteristics of repeater. As a result, EMC shield structure established in each component of mounted equipment can be omitted, thereby allowing a reduction in both the weight and cost of equipment.

Moreover, the present invention further provides the effect of enabling stronger coupling members for securing a thermal blanket to the satellite body.

The above and other objects, features, and advantages of the present invention will become apparent from the following description based on the accompanying drawings which illustrate an example of a preferred embodiment of the present invention.

BRIEF DESCRIPTION OF THE DRAWINGS

FIG. 3(A) being a sectional and plan view, and FIG. 3(B) being a partial schematic sectional view showing the configuration using the structure shown in FIG. 3(A) in the coupling portion of a case.

DETAILED DESCRIPTION OF THE PREFERRED EMBODIMENTS

Figure 1:
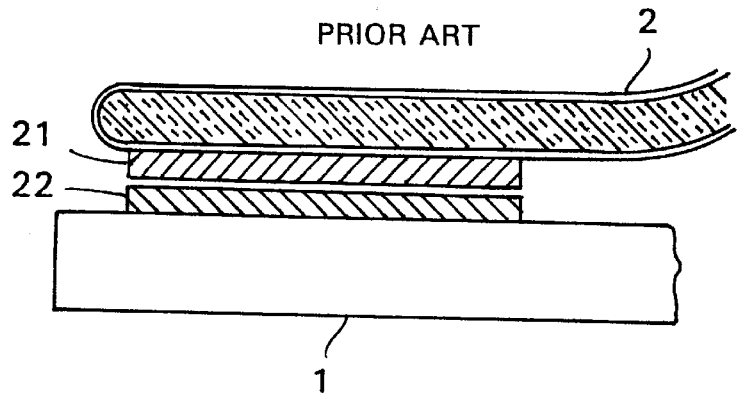
FIG. 1 is a schematic sectional view in the axial direction of an electromagnetic shielding structure according to the prior art.
Figure 2A:
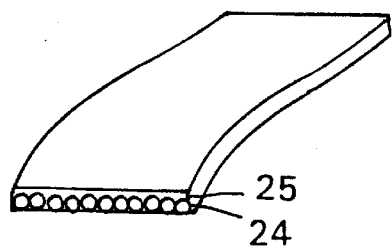
FIG. 2A is a schematic perspective view of one form of an electromagnetic shielding structure according to the prior art.
Figure 2B:
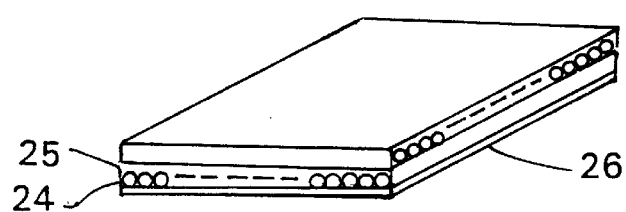
FIG. 2B is a schematic perspective view of another form of an electromagnetic shielding structure according to the prior art.
Figure 3A:
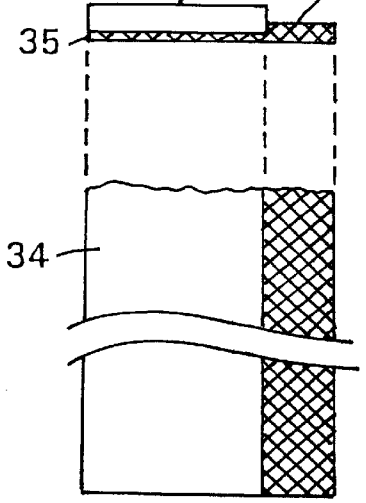
FIGS. 3A and 3B are a schematic view showing an electromagnetic shielding structure according to the prior art.
Figure 3B:
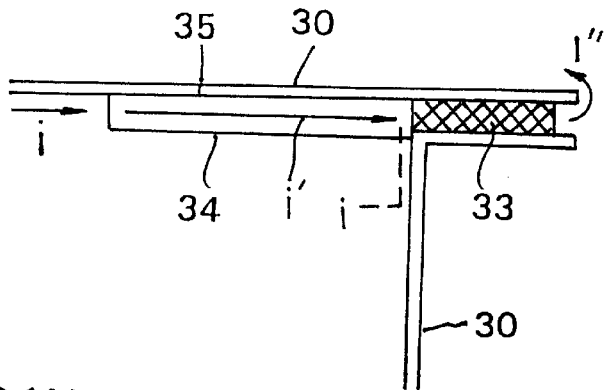
Figure 4:
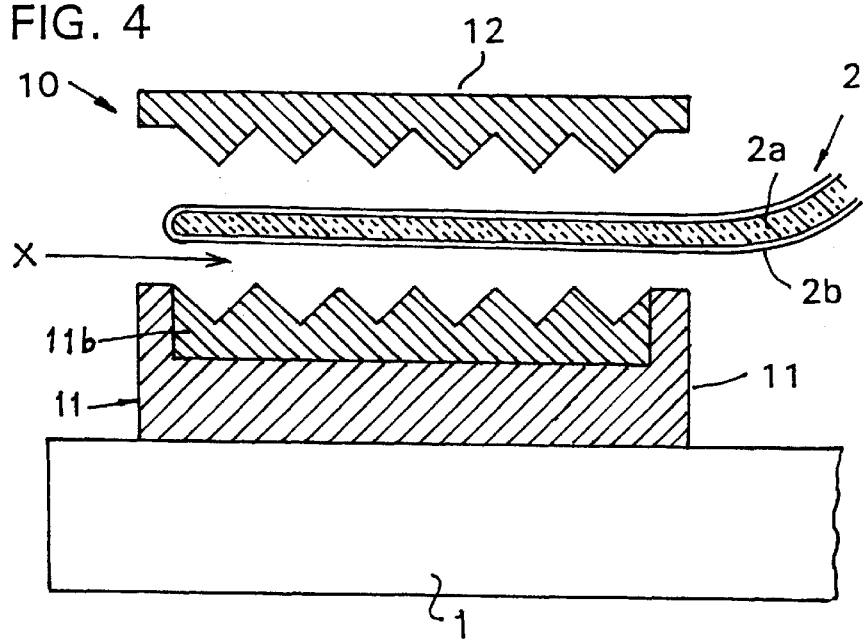
FIG. 4 is an exploded schematic view showing a section in the axial direction of an electromagnetic shielding structure according to the present invention.

An embodiment of the present invention will next be explained with reference to the accompanying figures. FIG. 4 is a schematic vertical section in the axial direction and shows an exploded view of a portion of an embodiment of the electromagnetic shielding structure of the present invention.

Figure 6:
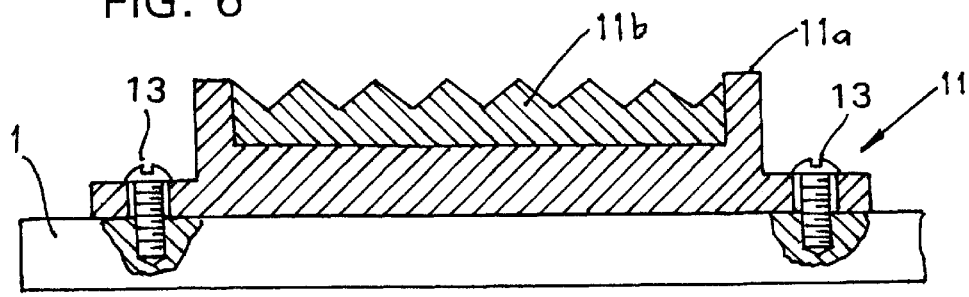
FIG. 6 show a further embodiment of the invention showing how the shielding structure according to the present invention may be mounted to a satellite using screws.

Satellite body 1 is one portion of a panel forming a satellite and supports equipment such as antennas or repeaters (not shown). Thermal blanket 2, which is formed by covering the surface of heat insulating material 2a with metal foil 2b, surrounds equipment mounted on the satellite and provides insulation from high heat. Electromagnetic shielding structure 10 is formed from first bracket 11 and second bracket 12 and is arranged at the edge portion of thermal blanket 2 to secure thermal blanket 2 to satellite body 1. First bracket 11 is formed from box plate 11a, which is a metal form having a rectangular c-shaped cross section, and radio wave-absorbing material 11b which fills the interior of c-shaped box plate 11a. The surface of box plate 11a that contacts satellite body 1 can be brought into close contact with satellite body 1 and joined to satellite body 1 by screw means shown in FIG. 6. Radio wave-absorbing material 11b has a serrate cross section. Second bracket 12 forms a cover having a plan shape substantially identical to that of the first bracket 11, and is provided with a serrate fitting surface that meshes with the serrate cross section of radio wave-absorbing material 11b of first bracket 11.

Figure 5:
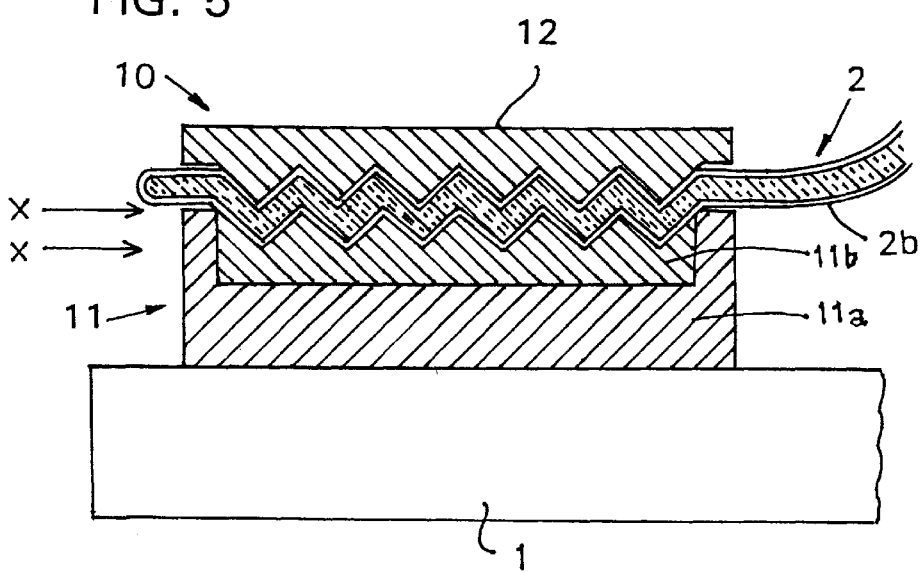
FIG. 5 is an assembled schematic view of FIG. 4.

The edge portion of thermal blanket 2 is held between first bracket 11 and second bracket 12, and when second bracket 12 is pressed, the upper and lower surfaces of thermal blanket 2 are tightly compressed between the serrate depressions and projections of each of the first and second brackets and thereby secured as shown in FIG. 5. First bracket 11 is joined to satellite body 1 by screw means, and therefore, thermal blanket 2 is secured to satellite body 1 by means of structure 10.

In FIG. 5, of radio waves emitted from a satellite antenna, radio waves infiltrating the satellite interior as leaked signal X are attenuated by metal box plate 11a and radio wave-absorbing material 11b which form first bracket 11. Here, metal foil 2b of the inner surface of thermal blanket 2 and the serrated surface of radio wave-absorbing material 11b are pressed together in close contact, and leaked signals passing through the gap between thermal blanket 2 and radio wave-absorbing material 11b must traverse a long passage and are therefore greatly attenuated.

The present embodiment discloses only a serrate cross-section shape for the radio wave-absorbing material and second bracket securing the thermal blanket, but these cross sections may also be of other mutually matching form, such as a wavelike form or a square form.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. An electromagnetic shielding structure comprising first and second opposing members each having an opposing surface, one of said opposing surfaces capable of being arranged adjacent the other of said opposing surfaces; at least one of said members comprising a radio wave-absorbing material, a surface of the radio wave-absorbing material comprising one of said opposing surfaces, said surface of the radio wave-absorbing material being an uneven surface, and further wherein the shielding structure is arranged as a securing device between a satellite body and a thermal blanket for securing the thermal blanket to the satellite body, the first opposing member comprising a first bracket, a first surface of said first bracket comprising said uneven surface of said radio wave-absorbing material, said first bracket having a second surface adapted to be brought into contact with the satellite body; and the second opposing member comprising a second bracket having an uneven surface that can fit together with the uneven surface of said radio wave-absorbing material of said first bracket and, with said uneven surface of said second bracket, said thermal blanket may be pressed against said first bracket and secured between the uneven surfaces of said first and second brackets.

2. The electromagnetic shielding structure according to claim 1 further comprising a screw for securing said first bracket and said satellite body in contact.

3. The electromagnetic shielding structure according to claim 1, wherein each of said uneven surfaces is in a serrate form.

4. The electromagnetic shielding structure according to claim 3 further comprising a screw for securing said first bracket and said satellite body in contact.

5. An electromagnetic shielding structure comprising first and second opposing members, each having an opposing surface, one of said opposing surfaces capable of being arranged adjacent the other of said opposing surfaces, at least one of said members comprising a radio wave-absorbing material, a surface of the radio wave-absorbing material comprising one of said opposing surfaces; said surface of the radio wave-absorbing material being an uneven surface, said electromagnetic shielding structure being arranged as a securing device between a satellite body and a thermal blanket for securing the thermal blanket to the satellite body:

the first opposing member comprising a first bracket, a first surface of said first bracket comprising said uneven surface of said radio wave-absorbing material, said first bracket further having a second surface adapted to be brought into contact with the satellite body; and the second opposing member comprising a second bracket having an uneven surface that can fit together with the uneven surface of said radio wave-absorbing material of said first bracket and, with said uneven surface of said second bracket, said thermal blanket may be pressed against said first bracket and secured between the uneven surfaces of said first and second brackets, with the thermal blanket conforming to said uneven surfaces of the first and second brackets.

6. The electromagnetic shielding structure of claim 5 wherein each of said uneven surfaces is in serrate form.

7. The electromagnetic shielding structure according to claim 5 further comprising a screw for securing said first bracket and the satellite body in contact.

* * * * *